April 16, 1963 R. F. RUTZ 3,085,310
SEMICONDUCTOR DEVICE
Filed Dec. 12, 1958 2 Sheets-Sheet 1

INVENTOR
Richard F. Rutz
BY Geoffrey Knight
ATTORNEY

April 16, 1963 R. F. RUTZ 3,085,310

SEMICONDUCTOR DEVICE

Filed Dec. 12, 1958 2 Sheets-Sheet 2

INVENTOR
Richard F. Rutz

BY Geoffrey Knight
ATTORNEY 3,085,310

SEMICONDUCTOR DEVICE

Richard F. Rutz, Fishkill, N.Y., assignor to International Business Machines Corporation, New York, N.Y., a corporation of New York Filed Dec. 12, 1958, Ser. No. 779,959
1 Claim. (Cl. 29—25.3)

This invention relates to semiconductor devices and more particularly to high-speed, high-current switching diodes and an improved method of making the same.

If a voltage in the reverse direction is suddenly placed across a semiconductor diode, after the diode has been conducting a heavy current in the forward direction, it has been observed that a relatively large reverse current is initially conducted which then decays to the normal low steady state value. This decay time, known as recovery time, limits the rate at which the diode can be switched. This diode recovery time is caused by minority current carriers remaining in the bulk of the semiconductor material for a period of time after the heavy forward current is removed. Switching diodes, according to the prior art, have recovery times of the order of tenths of a microsecond with forward currents in the ten milliamperes range and of the order of tens of microseconds with forward currents in the ampere range. Additionally, when a semiconductor diode, which has been reverse-biased, is suddenly switched to its conduction state an excess of current or overshoot results.

My invention is a diode having parameters and characteristics which make it ideal for switching applications and includes a method of fabricating such a diode.

The diode of this invention employs a region of first conductivity type having, essentially, a constant value of resistivity and a second region of opposite conductivity type having a gradient of resistivity. This graded resistivity region produces an electric field within this region of the diode and the presence of this electric field adds a drift component to the diffusion component of motion of the minority carriers in the region, so that the minority carriers reach the junction more rapidly and those carriers that are stored when the supply voltage is suddenly reversed will more rapidly be swept out of the region. Additionally, the diode employs a novel geometry which minimizes the distance from the PN junction to the semiconductor surfaces at which the external terminals are applied. These surfaces act as regions where ideally infinite recombination rates occur and hence can be considered as sinks for minority carriers in excess of the equilibrium concentration. The diode, according to the invention, exhibits improved recovery characteristics and freedom from overshoots as well as a low forward resistance, while maintaining a high back resistance and minimum capacitance.

An object of the invention is to provide an improved switching diode.

Another object of the invention is to provide a semiconductor diode having a minimum recovery time.

Yet another object of the invention is to provide a high-current switching diode.

Still another object of this invention is to provide a switching diode combining the features of low forward resistance and small minority carrier storage time.

Another object of the invention is to provide a method of making a high-speed, high-current switching diode.

Other objects of the invention will be pointed out in the following description and claim and illustrated in the accompanying drawings, which disclose, by way of example, the principle of the invention and the best mode which has been contemplated of applying that principle.

Extrinsic conductivity in semiconductors is divided into two classes; when electrons are the predominant current carriers, the class is designated as N type, and when holes are the predominant current carrier, the class is designated P type. Each particular conductivity class is determined solely by the impurities present in the semiconductor crystal structure. Small amounts of impurities such as arsenic, antimony and phosphorous which are classed as group V elements are termed donor impurities when added to semiconductor elements of group IV, which may be germanium or silicon, since they contribute an excess of free electrons to the crystal structure. These excess free electrons can become current carriers and therefore the semiconductor material is converted to N type conductivity. In a similar manner impurities such as gallium and indium of group III are known as acceptor impurities since they provide an excess of free holes to the crystal structure, thereby converting the semiconductor material to P type conductivity. If both types of impurities are present the conductivity is determined by the predominant impurity.

When the semiconductor crystal structure contains two zones of opposite conductivity types contacting in a common plane or barrier the crystal is useful as an electrical rectifier affording a relatively low resistance to a flow of current when one polarity of voltage is impressed across the barrier, and a relatively high resistance when the polarity of voltage is reversed. Electrical rectifiers constructed in this manner are known as junction type rectifiers to distinguish them from the well-known point contact type and it is to the junction type rectifier that the invention relates.

In a junction type switching diode the recovery time during which the diode back resistance is varying from a low value to its normal high steady state value, which recovery time occurs when a normally conducting diode is suddenly reverse-biased, is caused by the storage of minority carriers. During forward conduction, carriers which are majority carriers on one side of the junction are injected into the other side where they become minority carriers in excess of the amount normally present and the conductivity is modulated so that a very low impedance is achieved. On the reverse bias condition, the very low impedance condition persists until the excess carriers migrate to the terminals or recross the junction, or else recombine with majority carriers in the bulk material.

Figure 1:
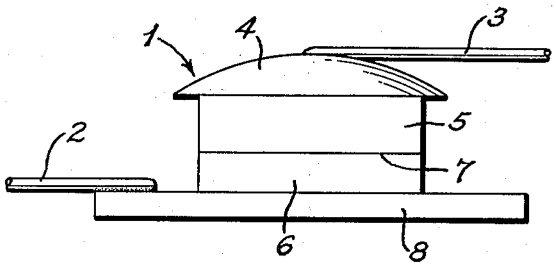
FIG. 1 is an elevation of a switching diode illustrating the invention.

Referring now to FIG. 1, a novel semiconductor 1 illustrative of my invention is shown having, by way of example, a P type zone of conductivity 5 and an N type zone of conductivity 6 meeting in the common PN barrier or junction 7. Terminal leads 2 and 3 are connected to the N and P type conductivity regions by the ohmic contacts 8 and 4; the ohmic contact 8 being connected to the N type conductivity region 6 by a soldering operation and ohmic contact 4 being connected to the P type conductivity region 5 by an alloying operation. Additionally the ohmic contacts 8 and 4 serve as heat sinks for the semiconductor diode. The N type region 6, as shown, contains a gradient of resistivity which varies from a value which is low at the ohmic contact 8 to a higher value at the PN junction 7, as will be more particularly hereinafter described. The P type region 5 as shown contains a relatively constant value of resistivity which is reduced to a relatively low value of resistivity near the surface of the ohmic contact 4.

Figure 2:
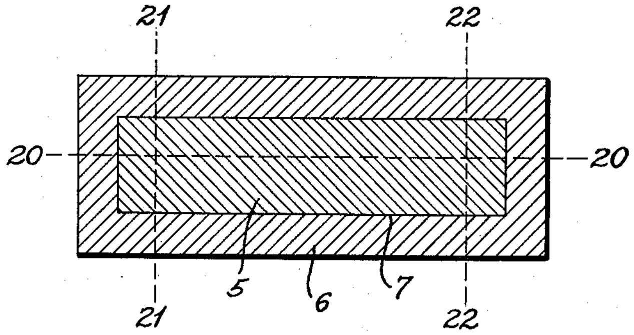
FIG. 2 is a cross section of the crystal wafer after diffusing impurities into it.

The semiconductor diode of FIG. 1 is preferably made in the following novel manner which comprises the steps of vapor diffusion of a first conductivity type crystal structure, shaping the resultant crystal wafer, supplying ohmic contacts to the crystal wafer, and etching the crystal wafer to obtain a diode having a maximum electrode surface area to junction area. This process results in a diode having parameters that are nearly ideal for switching applications. A thin flat wafer of a first conductivity type semiconductor material having a resistivity sufficiently high to allow the formation of a graded resistivity region by means of vapor diffusion is provided by any of several processes standard in the art. A portion of this first conductivity type semiconductor wafer is next converted to a conductivity type opposite that of the original semiconductor wafer by means of vapor diffusion. The technique of vapor diffusion is well known in the art and is accomplished by heating the semiconductor wafer in a controlled atmosphere at a high temperature in the presence of a vapor containing a conductivity directing impurity of the type opposite to the conductivity of the semiconductor wafer so that the energy imparted by the heat to the impurity atoms causes them to penetrate into the crystal structure. This produces a region of opposite conductivity in the wafer and provides this region with a resistivity that is low at the surface and is nearly equal to the intrinsic resistivity of the semiconductor at the junction 7. FIG. 2 shows a cross-sectional view of a wafer prepared as described above and in which region 5 is of the original conductivity type surrounded by region 6 of the converted opposite conductivity type.

Figure 3:
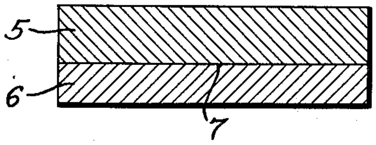
FIG. 3 is a cross section of the body of the diode after removal of the material not required for the body.

The next step in the process is to remove from the wafer the materials not necessary in the formation of the body of the diode., Referring again to FIG. 2 the wafer is cut along the lines shown as 20—20, 21—21 and 22—22 and converted to the wafer shown in FIG. 3. In FIG. 3 there is shown a region 5 of P type conductivity, a region 6 of N type conductivity containing a gradient of resistivity which varies from the low value at the surface to a higher value at the junction 7. The removal of the material from the wafer shown in FIG. 2 to provide the wafer of FIG. 3 may be performed in any conventional manner such as sawing, etching or abrading.

Figure 4:
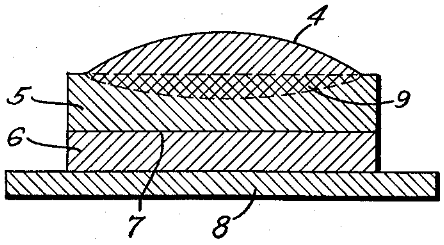
FIG. 4 is a cross section of the body of the diode after ohmic contacts have been applied thereto.

The next step in the process is to attach low resistance ohmic contacts to the surfaces of the original conductivity type region and the converted opposite type conductivity region. Because the converted conductivity type region has a low value of resistivity on the surface, resulting from the vapor diffusion process, a soldering operation is sufficient to obtain a low resistance contact. Through the use of an electrically inert solder such as lead, the ohmic contact 8 is attached directly to the surface of the converted conductivity type region 6. However, since the region of original conductivity material 5 has a relatively high value of resistivity, an alloying operation is performed to reduce the surface resistivity of the original conductivity type region. A dot containing conductivity type directing impurities of the same type as the original semiconductor material is alloyed to the region 5 for a time and at a temperature whereby the depth of penetration of the dot is less than the depth of the original region 5. As an example, if the original conductivity was P type, acceptor impurities should be employed and conversely if the original conductivity was N type, then donor impurities should be used in the alloying operation. As shown in FIG. 4, the alloying operation produces a thin region 9 in the original conductivity material which contains a relatively low value of resistivity to form a low resistance surface for the ohmic contact.

Figure 5:
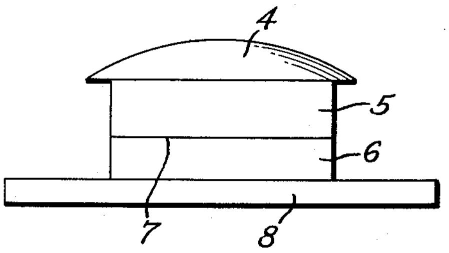
FIG. 5 is a view of the body of the diode after etching.

The next step in the process is an etching operation to convert the structure shown in FIG. 4 to the structure shown in FIG. 5. The body of the diode is electrically etched in a solution of potassium hydroxide, sodium hydroxide or the like, to remove all the semiconductor material except that directly between the alloyed region and the ohmic contact 8. The final step in the process is the attaching of terminal leads 2 and 3 to the respective ohmic contacts 8 and 4.

Figure 6:
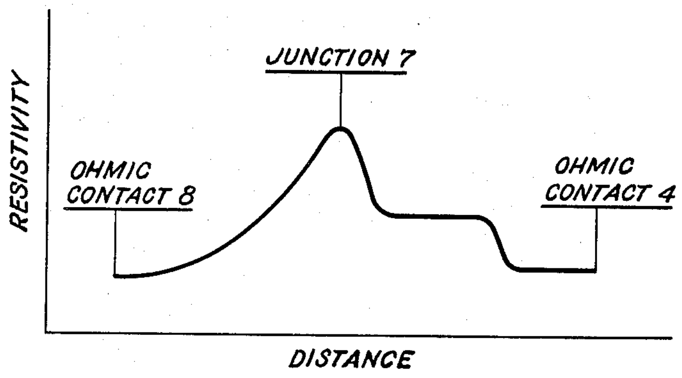
FIG. 6 is curve showing a variation of resistivity in the diode from one surface to the other.

The semiconductor rectifier fabricated by the above described process has a variation of resistivity through the body of the device as shown in FIG. 6. As there shown, beginning at ohmic contact 8, the device has a relatively low value of resistivity which increases to a relatively high value at the PN junction 7, then falls to a relatively constant value through the original conductivity type material thence falling to a relatively low value in the zone produced by the alloying operation and terminating in ohmic contact 4.

In order to aid in understanding the invention the following information on specific values and materials is presented, by way of example, but it should be understood that variations in the specific values and materials may be employed by those skilled in the art while maintaining the advantages afforded by the hereinbefore described process.

A germanium wafer of P type conductivity having a resistivity of 7 ohm-centimeter was maintained at a temperature of 800 degrees centigrade for 24 hours in an arsenic atmosphere. The resulting wafer containing a converted region of N type conductivity was cut to produce pellets having N and P type regions meeting in a PN junction. The PN junction was essentially in the center of the pellets and the error if any resulted in the PN junction being located slightly towards the N type conductivity surface. A pellet was next lapped to produce a die having a thickness of about 0.002 inch, and a length, parallel to the PN junction, of about 0.02 inch. Lead solder was employed to attach a copper base to the surface of the N type conductivity region. An impurity dot containing indium was then alloyed to the surface of the P type region and the alloying operation was controlled so that the depth of penetration of the indium was kept to a few tenths of one thousandths of an inch. After the alloying operation, the die was electrically etched in a 5% potassium hydroxide solution to remove all the germanium that was not directly under the alloyed indium dot. The resulting germanium die had a diameter of 0.009 inch and a height of 0.0015 inch.

The diode formed by the above-described process had the characteristics as shown in the following table:

| | |
|---|---|
| Forward voltage drop | 0.38 volt at 0.1 ampere.<br>0.54 volt at 1.0 ampere. |
| Reverse breakdown voltage | 125 volts. |
| Reverse current | 5 microamperes at 20 volts. |
| Capacity | 2 micromicrofarads. |

Figure 7:
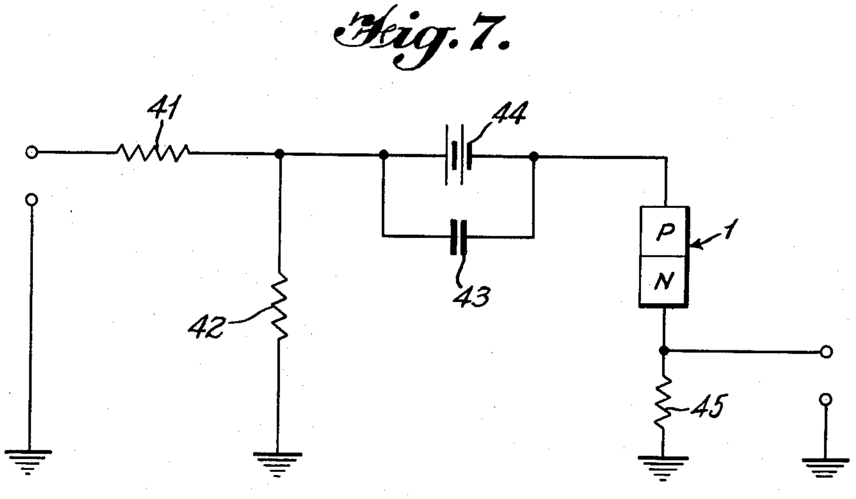
FIG.7 is a schematic diagram of the circuit employed in testing the diode.

As a means of determining the recovery time of the diode after conducting a forward current of 1 ampere, the circuit shown in FIG. 7 was used. The components of FIG. 7 had the following values:

| | | |
|---|---|---|
| Resistor 41 | ohms | 35 |
| Resistor 42 | do | 10 |
| Resistor 45 | do | 2 |
| Capacitor 43 | microfarads | 0.01 |
| Battery 44 | volts | 6 |

The measured recovery time of the diode when switching from a forward current of 1 ampere to a reverse bias of 6 volts was 50 millimicroseconds. Various other diodes were constructed by the hereinbefore described process and exhibited recovery times between 40 and 70 millimicroseconds.

What has been disclosed is a novel combination of steps producing a novel high-speed, high-current diode having in combination the following advantages:

Minimum recovery time permitting higher speed of operation.

Freedom of overshoots.

Very low forward resistance reducing the amount of power dissipated within the diode body thereby obtaining more stable operating characteristics.

Minimum reverse current allowing greater isolation of circuits.

Greater forward currents, and,

A high reverse breakdown voltage.

In the above-description of the process of making this high-speed, high-current diode only the major steps in the process have been stressed and the fine points in the technology made necessary by the small sizes being handled have been omitted since they are familiar to one skilled in the art.

While there have been shown and described and pointed out the fundamental novel features of the invention as applied to the preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claim.

What is claimed is:

A process of making a high speed, high current switching diode comprising, in combination, the steps of:

providing a P-type germanium wafer which exhibits a relatively high value of resistivity;

converting all of the external surfaces of said wafer to N-type conductivity to a predetermined depth, said converted surface of N-type conductivity exhibiting a gradient of resistivity;

cutting a die from said wafer, said die having a region of P-type conductivity and a region of N-type conductivity, each of said regions being substantially equal in thickness and said regions being joined in a P-N junction, said gradient of resistivity in said region of N-type conductivity varying from a value which is low at the major surface thereof which is parallel to said P-N junction to a high value at said P-N junction;

soldering a large area ohmic contact to said entire major surface of said N-type conductivity region;

alloying a small area ohmic contact to the major surface of said P-type conductivity region which is parallel to said P-N junction, the depth of said alloyed zone thus formed being less than the depth of said P-type conductivity region, said alloyed ohmic contact containing sufficient P-type conductivity-determining impurities to impart to said alloyed zone a resistivity much less than the resistivity of said P-type germanium wafer; and removing by eaching all of the germanium wafer not directly under said alloyed small area ohmic contact.

References Cited in the file of this patent

UNITED STATES PATENTS

| | | |
|---|---|---|
| 2,603,693 | Kircher | July 15, 1952 |
| 2,829,422 | Fuller | Apr. 8, 1958 |
| 2,842,723 | Koch et al. | July 8, 1958 |
| 2,842,831 | Pfann | July 15, 1958 |
| 2,849,664 | Beale | Aug. 26, 1958 |
| 2,910,634 | Rutz | Oct. 27, 1959 |
| 2,929,859 | Loferski | Mar. 22, 1960 |